United States Patent
Ditzel et al.

(10) Patent No.: US 8,153,232 B2
(45) Date of Patent: Apr. 10, 2012

(54) LAMINATED SUBSTRATES FOR MOUNTING ELECTRONIC PARTS AND METHODS FOR MAKING SAME

(75) Inventors: Eckhard Ditzel, Linsengericht (DE); Siegfried Walter, Gelnhausen-Höchst (DE); Manfred Gresch, Neu-Anspach (DE)

(73) Assignee: W.C. Heraeus GmbH, Hanau (DE)

( * ) Notice: Subject to any disclaimer, the term of this patent is extended or adjusted under 35 U.S.C. 154(b) by 1038 days.

(21) Appl. No.: 12/047,353

(22) Filed: Mar. 13, 2008

(65) Prior Publication Data

US 2008/0220202 A1 Sep. 11, 2008

Related U.S. Application Data

(63) Continuation of application No. PCT/EP2006/008783, filed on Sep. 8, 2006.

(30) Foreign Application Priority Data

Sep. 14, 2005 (DE) .......................... 10 2005 044 001

(51) Int. Cl.
*B32B 3/24* (2006.01)
*B65D 85/90* (2006.01)

(52) U.S. Cl. ........ 428/132; 428/133; 206/717; 174/528; 174/533; 361/758; 361/760; 257/735

(58) Field of Classification Search .................. 428/133, 428/132; 257/735; 174/528, 533; 361/758, 361/760; 206/717
See application file for complete search history.

(56) References Cited

U.S. PATENT DOCUMENTS

| | | | | |
|---|---|---|---|---|
| 3,908,075 | A | * | 9/1975 | Jackson et al. ................. 428/133 |
| 4,549,247 | A | | 10/1985 | Hoppe et al. |
| 6,537,646 | B2 | * | 3/2003 | Haygood et al. .............. 428/132 |

FOREIGN PATENT DOCUMENTS

| | | |
|---|---|---|
| DE | 2064856 A | 7/1971 |
| DE | 3123198 A1 | 7/1982 |
| DE | 19521022 A1 | 12/1996 |
| DE | 19635732 A1 | 3/1998 |
| DE | 19852832 C2 | 5/2000 |

OTHER PUBLICATIONS

A German Office Action for the corresponding German Application No. 10 2005 044 001.0-33; dated May 12, 2006; 7 pages and 2 pages of English translation.

* cited by examiner

*Primary Examiner* — William P Watkins, III
(74) *Attorney, Agent, or Firm* — Panitch Schwarze Belisario & Nadel LLP

(57) ABSTRACT

A method is provided for producing a laminated substrate for mounting semiconductor chips. At least respective metal and plastic structure films having respective different recurrent contours are laminated together in such a way that a material strip is obtained. The lamination is followed by perforations or cuttings, and the method includes at least one of the following steps:
A. the films are structured in such a way that superposition thereof makes it possible to obtain the areas which are devoid of overlap through the total width thereof;
B. the films are not laminated through the total width of the laminate in partly recurrent areas; and
C. recurrent segments of the recurrent contours are bent out of the surface of the laminated strip starting from the laminate.

6 Claims, 5 Drawing Sheets

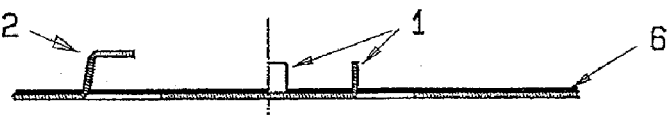
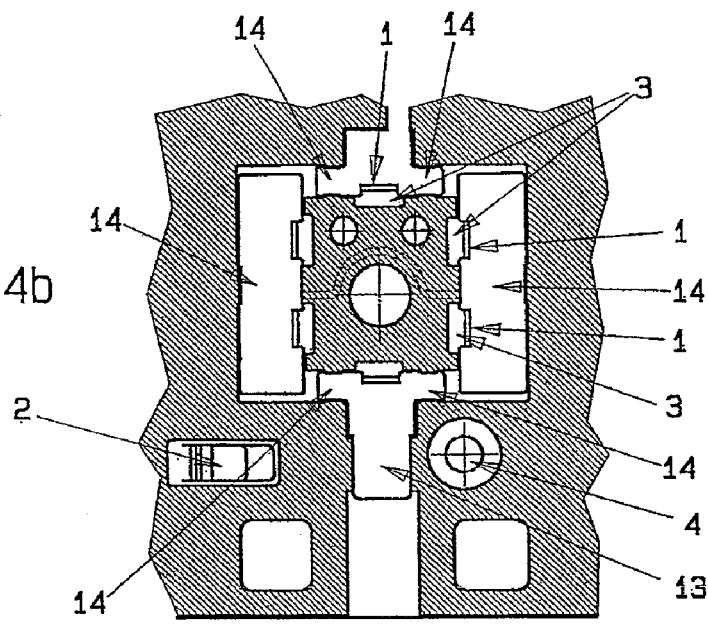
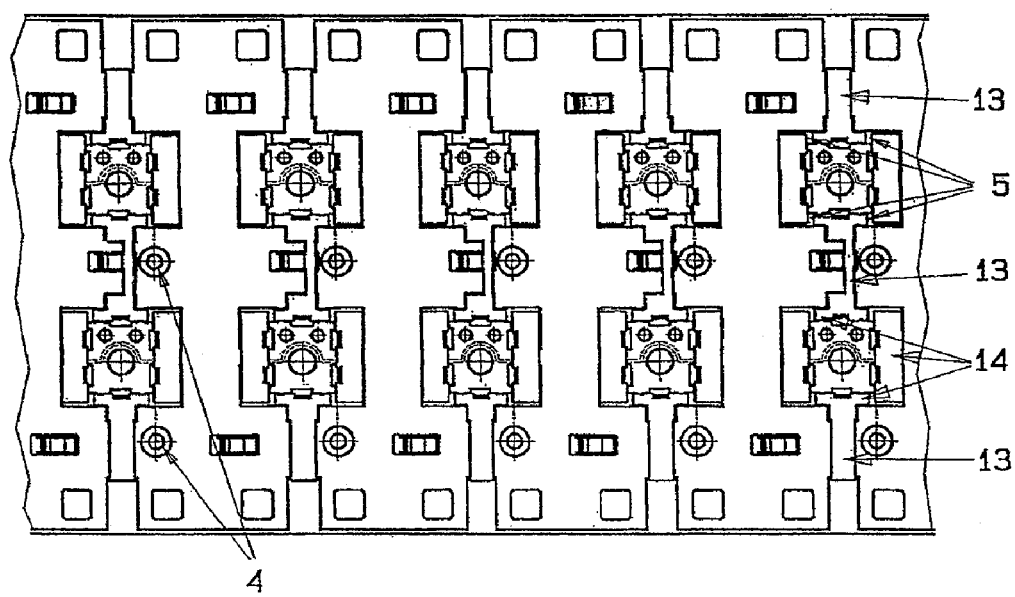

LAMINATED SUBSTRATES FOR MOUNTING ELECTRONIC PARTS AND METHODS FOR MAKING SAME

CROSS-REFERENCE TO RELATED APPLICATIONS

This application is a Continuation of International Application No. PCT/EP2006/008783, filed Sep. 8, 2006, which was published in the German language on Mar. 22, 2007, under International Publication No. WO 2007/031241 A1 and the disclosure of which is incorporated herein by reference.

BACKGROUND OF THE INVENTION

This invention relates to methods for producing a laminated substrates for mounting semiconductor chips by laminating together at least respective metal and plastic structure films. The invention also relates to strip-shaped laminates as a preliminary stage of the substrates.

According to German published patent application DE 195 21 022 A1, one metal film sheet and one plastic film sheet are separately stamped and thereafter bonded with each other to an "endless strip," wherein preferably guiding pins engage in superposed position markings of the film sheets to be bonded with each other.

In clean room applications, the laminate abrasion occurring during the isolation of the substrates is an undesirable contamination.

The sensitivity of ever more miniaturized electronic parts to mechanical stresses is also problematic.

BRIEF SUMMARY OF THE INVENTION

It is the object of this invention to better protect electronic parts against mechanical stresses, reduce the contamination through laminate abrasion upon isolation, provide simplifications for processing such laminate substrates, and enable more flexible application potentials for the substrates.

The following features are useful for the solution of the problem, in particular in combination with a plurality of these features:
A) The films are structured in such a way that the superposition thereof makes it possible to obtain areas which are devoid of overlap through the total width thereof.
B) The films are not laminated through the total width of the laminate in partly recurrent areas.
C) The recurrent segment of the recurrent contours are bent out of the surface of the laminated strip starting from the laminate.

When films according to feature A) or B) are structured in such a way that the superposition thereof makes it possible to obtain the areas which are devoid of overlap or lamination through the total thickness thereof, these areas enable a complete removal of one or a plurality of films through the total thickness of the laminated strip, so that the laminated strip in this area consists exclusively of the remaining film(s) and all structuring steps are performed on non-laminated material.

A strip-shaped laminate is thus provided of at least respective metal and plastic structure films, whose films have respective different recurrent contours, and the laminate has areas in which the structured films are devoid of overlap through the total width of the strip, or a film of the laminate is structured in non-connected contours.

When recurrent cross-sections of the recurrent patterns are curved from the surface of the laminated strip starting from the laminate according to feature C), free areas are thereby created in the surface of the laminated strip and with these areas, in turn, the same effect can be achieved as with features A) and B) on the one hand, namely the removal of one or a plurality of films through the total width of the laminated strip, maintaining one or a plurality of films. On the other hand, the curved segments are suitable to fix receiving parts in place and protect them from mechanical stress.

Any tongues projecting from the surface of the strip are prone to damage when winding the strip, and they tend to get caught when unwinding the strip. These problems can be eliminated with spacers. A strip-shaped laminate is thus provided of at least respective metal and plastic structure films, whose films have respective different recurrent contours, and the laminate has segments curved from its base surface which are particularly designed as tongues or spacers.

In a preferred embodiment, a plurality of tongues is arranged as bands or side walls of a support, in particular a socket.

The tongues, arranged in particular in the form of a support, enable a particularly precise assembly. To fully utilize the offered precision, reference perforations are punched into a non-laminated area of a film, particularly a metal film, whose tolerance versus the known laminated guide perforations can be kept smaller. Perforations in a non-laminated area are particularly suitable as reference perforations, since their tolerance of ±0.01 mm versus the known positional markings (guide perforations) (tolerance: ±0.03 mm) is once more significantly reduced and enables a more precise fitting of the electronic parts. It has proven successful to punch reference perforations after the lamination.

All these laminates are suitable for providing laminated substrates for mounting semiconductor chips and are intermediate products in methods for producing substrates with at least respective metal and plastic structure films.

In a method, recurrent cross-sections of the recurrent contours are curved from the surface of the laminated strip starting from the laminate. In particular, recurrent cross-sections are curved to tongues or spacers.

Ideally, the films are structured in such a way that the superposition thereof makes it possible to obtain the areas which are devoid of overlap through the total width thereof. Accordingly, the films are not laminated through the total width of the laminate in partly recurrent areas.

A crucial method provides that a film of the laminated strip is separated into non-connected contours. This renders it possible that strip-shaped laminates are separated for isolation to substrates in those areas in which a film was interrupted.

In preferred embodiments, the following features may be used alone or in combination with one or more other features:
  the laminated substrates are carriers for semiconductor chips;
  the structured metal film is punched or etched;
  the plastic film is punched;
  the plastic film is fiber-reinforced, particularly fiberglass-reinforced;
  the respective different recurrent contours are punched in a punching device with a replaceable punching part;
  a free cutting is provided in the metal film to expose the subsequent tongues;
  the contour is punched for the subsequent spacers in the metal film without free cutting;
  the guide perforations for alignment of the superposed films are punched with the same punching tool into the metal film as well as into the plastic film;
  in the plastic film, free cuttings are punched in areas which are arranged around the subsequent tongues;

in the plastic film, free cuttings are punched in areas which are arranged around the subsequent spacers;

in the plastic film, free cuttings are punched in areas which are arranged around the subsequent reference perforations;

recesses are punched on the edge of the plastic film;

the respective different recurrent contours are punched in a punching device with replaceable punching modules;

the films are laminated with an adhesive to a strip;

the cuttings produce cross-sections which are curved;

two or three films are structured in such a way that the superposition thereof makes it possible to obtain the areas which are, at least with regard to one film, devoid of overlap through the total thickness thereof, or that at least one film is not laminated through the total thickness of the laminate in partly recurrent areas;

two differently structured metal films are separated from each other through one plastic film which is structured differently therefrom;

the strip-shaped laminate consists of a metal structure film between two plastic structure films, wherein the films have different recurrent contours;

a metal structure film is arranged between two identically structured plastic films;

the recurrent cross-sections of the recurrent contours are curved to strip-shaped tongues from the surface of the laminated strip starting from the laminate;

the tongues are curved perpendicularly or nearly perpendicularly, particularly in a range between 80° and 100° from the surface of the strip;

metallic tongues are curved through the plane of a free cutting of the plastic film;

the contours of the metallic tongues, as well as the free cutting in the plastic film, are generated before the lamination of the plastic film with the metal film;

recurrent cross-sections of the recurrent contours are curved to Z-shaped spacers from the surface of the laminated strip starting from this laminate;

the spacers project higher from the surface of the strip than the tongues;

a method comprises at least two of the steps A, B, and C;

a method comprises the three steps A, B and C;

the sequence of the steps A, B, and C is in the listed order;

a film is separated into non-connected contours in those areas which are devoid of overlap with the other film through the total width;

modules are produced in the laminate which are held in the laminate solely via metallic connections;

strip-shaped laminates for isolation to substrates are separated in those areas in which a film was interrupted;

the strip-shaped laminate comprises two structured metal films and one structured plastic film arranged between the metal films, wherein the films each have different recurrent patterns.

According to the invention, it is made possible to curve metallic tongues through the plane of a free cutting of a plastic film, because the contours for the tongues and the free cuttings in the respective films were already set up before lamination. The only remaining metallic connections of the modules permit a residue-free separation of the modules during isolation, which is important for high-purity applications. Thus, during isolation, generation of dust due to severing the plastic-containing connections will be prevented.

Furthermore, this renders it possible to arrange a plurality of tongues to each other, such that they form a support for receiving electronic parts. The tongues are the walls of the support. By means of the tongues, the support can be designed as a socket which holds electronic parts. Modules with sockets for electrical parts can be produced therewith. Still on the strip, the modules can be assembled with particularly high precision before they are isolated.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 4a is a plan view of the laminate of FIG. 3, with curved-up tongues and curved-up spacers;

FIG. 4b is an enlarged section of a still connected module from FIG. 4a;

FIG. 4c is a side view of the laminate of FIG. 3, with curved-up tongues and curved-up spacers, illustrating the tongues and spacers being curved from the surface of the laminate;

DETAILED DESCRIPTION OF THE INVENTION

The following illustrates the steps of the production process with the sequence of the Figures.

Figure 1:
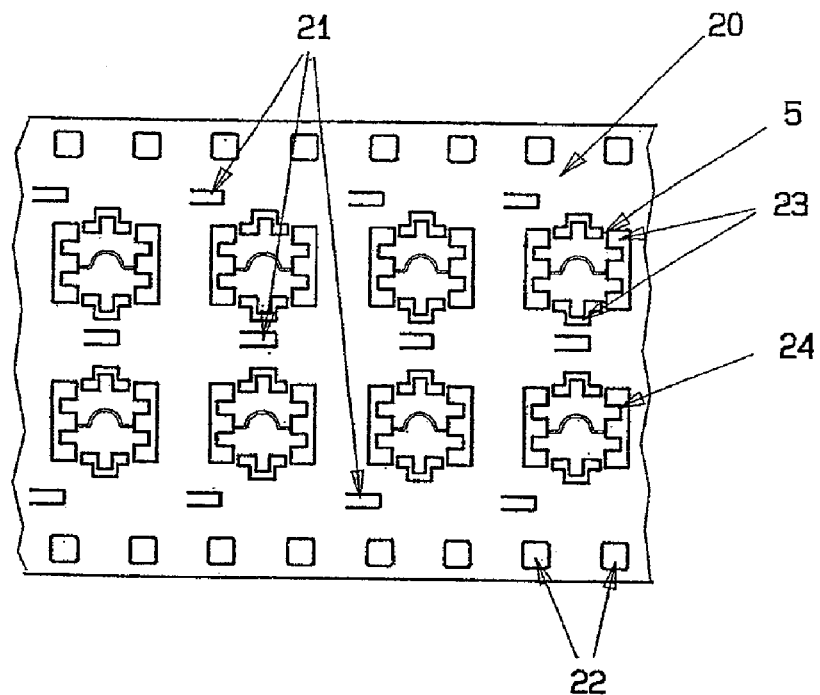
FIG. 1 is a plan view of a punched metal film according to an embodiment of the invention.
Figure 2:
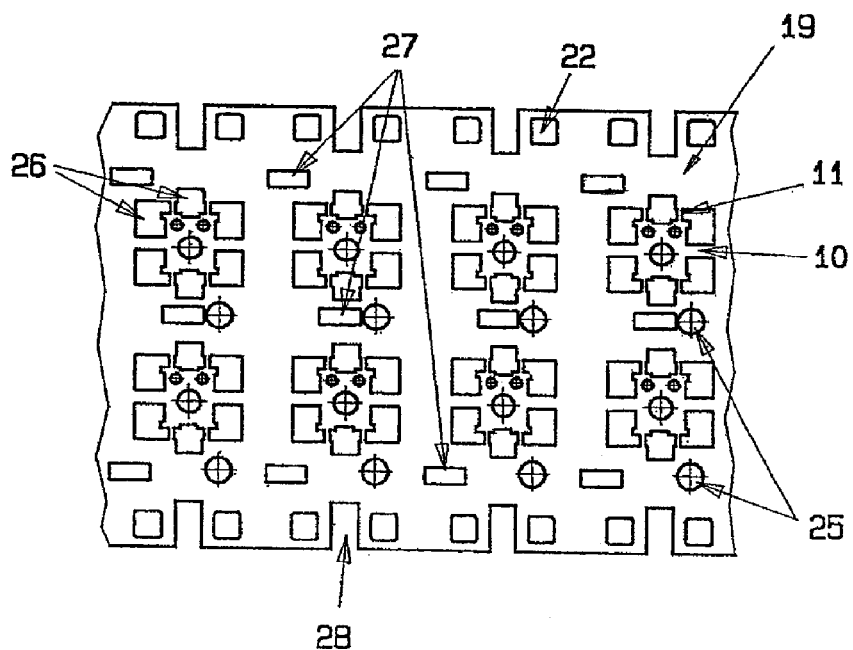
FIG. 2 is a plan view of a punched plastic film according to an embodiment of the invention.

For the production of a metal film 20 according to FIG. 1, a punching sequence is performed in a punching device providing recurrent contours 21, 22, 23, 24 in the form of punched images according to FIG. 1. Analogously, metal films according to FIG. 1 can also be structured by etching without the spacer outline. According to FIG. 2, other contours 25, 26, 27, 28 are analogously punched in the form of punched images with another punching tool into a plastic film 19. The films according to FIG. 1 and FIG. 2 are laminated by means of their guide perforations 22 to a metal/plastic film composite 6 according to FIGS. 3 and 4c. The outlines 21, 22, 23, 24, 25, 26, 27, 28 of the metal film 20 and of the plastic film 19 are laminated, with an accurate fit, to structures which produce the structure of the subsequent modules 18. From the laminate 6 according to FIG. 3, the plastic connections 10 are separated in the area of the tongues 24. The tongues 24 are curved up thereafter. The curved-up tongues 1 are shown in FIGS. 4a, b, c and d. The laminate according to FIGS. 4a, b, c, d is suitable for the assembly with electronic parts and can be isolated to the individual modules 18 according to FIG. 5 by severing the metallic connections 5 at the separation points 15 and 16.

FIG. 1 shows as contour 23 the free cutting 23 around the subsequently curved tongues 1. Between the contours 23 which produce the free cuttings 23, connections 5 are provided which maintain the connection of the islands—generated by the free cuttings 23—of the subsequent modules 18 with the outer area of the metal film 20. The contour 21 of the spacers is a punched cutting 21 for spacer 2. The contours 22 are punched-out guide perforations 22. The metal film 20 is only lanced in the area of spacers 2 according to FIG. 1. For this purpose, the spacers 2 are pushed back into the surface of the metal film after the cutting 21 is made with an accurate fit. The contour 24 defines the tongues 1 subsequently curved.

FIG. 2 shows the contours 25, 26, 27, 28 in the plastic film 19 as the free cuttings 25, 26, 27, 28 in the area of the subsequent tongues 24, spacers 2, reference perforations 4 and the punched-out guide perforations 22. The free cuttings thus expose tongues 24, the spacers 2 and the reference perforations 4. Moreover, recesses 28 are punched out at the edge. The contour 25 is a free cutting in the plastic film 19 for subsequent punching of the reference perforations 4 into the metal film 20. The contour 26 is a free cutting in the plastic film 19 which enables subsequent curving of the punched tongues 24 to tongues 1. Between the contours 26, which generate the free cuttings 26, connections 10 and 11 are provided, which maintain the connections of the outer area of the plastic film 19 with the islands—produced by free cuttings 26—of the subsequent modules 18. Analogously to contour 26, the contour 27 is a free cutting, which enables later curving of the spacers through the plane of the free cutting. The contour 28 is used as a free cutting with the free cuttings 26 according to contours 26 for the subsequent isolation of the modules through the subsequent free cuttings 13 (FIG. 4b).

Figure 3:
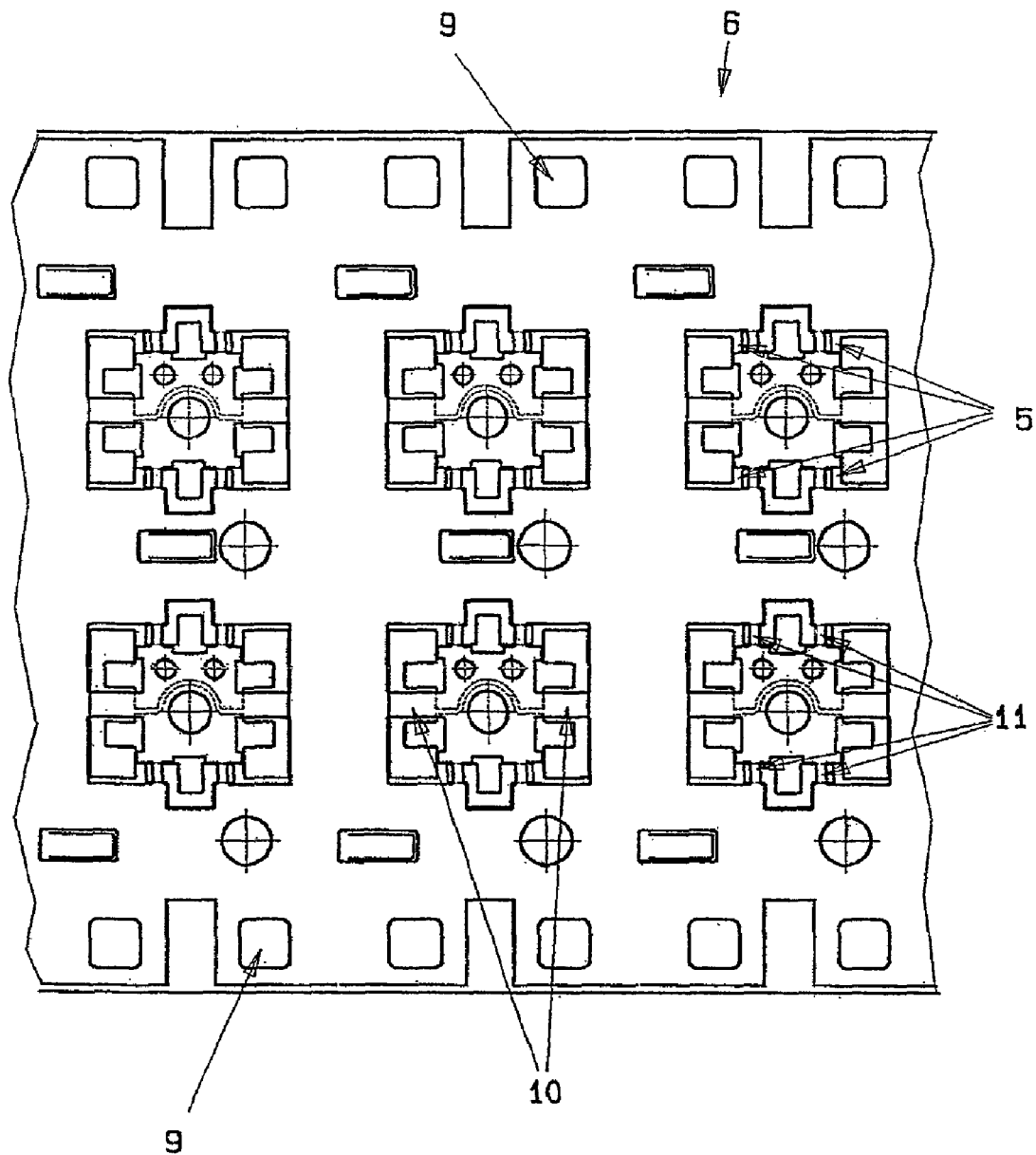
FIG. 3 is a plan view of a laminate from the metal film according to FIG. 1 and the plastic film according to FIG. 2.

FIG. 3 shows metallic connections 5 which are not covered by the plastic film 19 due to the free cuttings 26. The guide perforations 22 of the metal and plastic film are laminated superposed and with an accurate fit in laminate 6 as guide perforations 9. Due to the free cuttings 23, the plastic connections 10 and 11 are not laminated on the metal film.

Figure 4D:
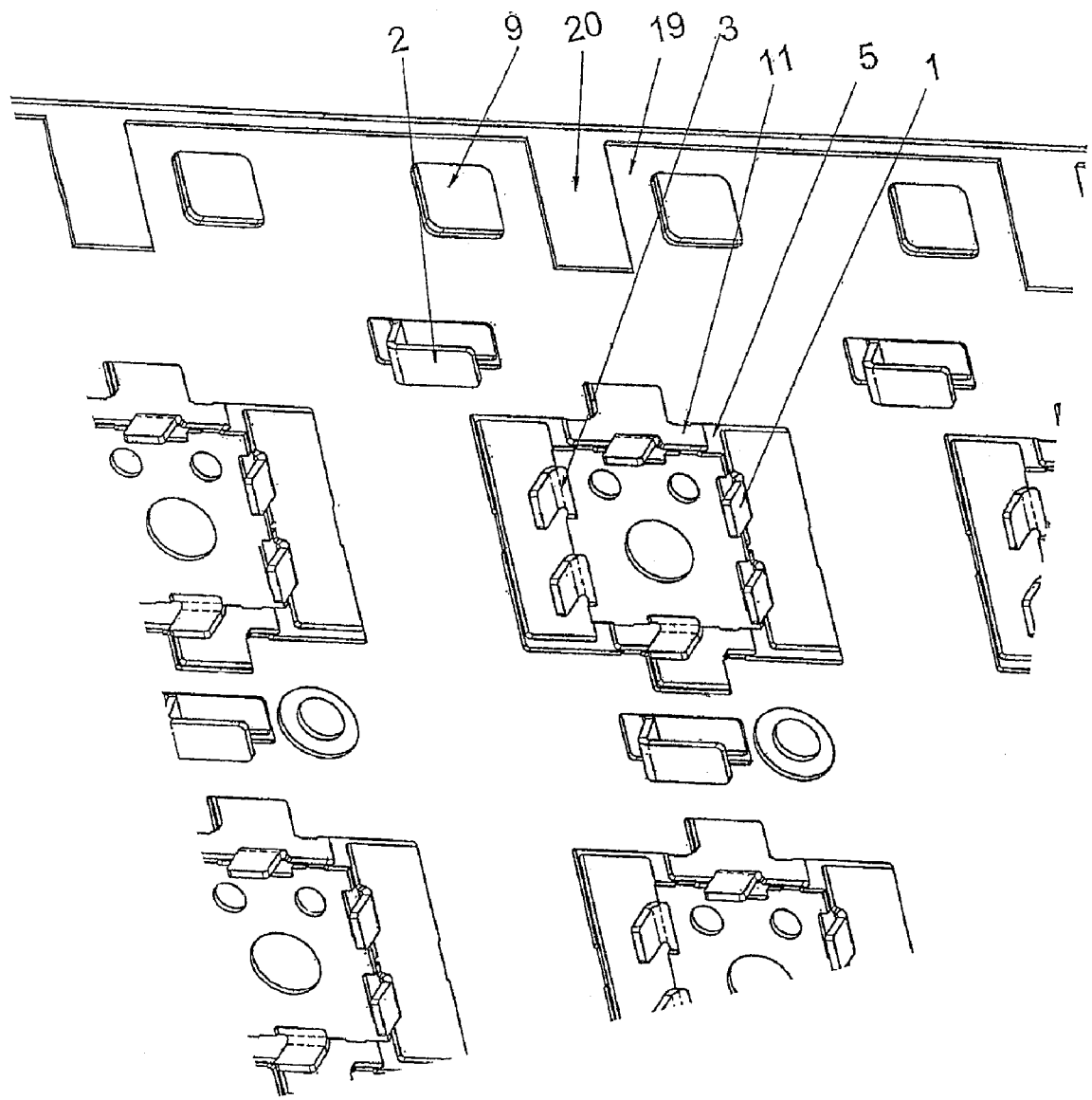
FIG. 4d is a three-dimensional, perspective plan view of the laminate of FIG. 3 with curved-up tongues and curved-up spacers, and with round guide perforations.

After lamination of the films 19 and 20 to a laminate 6 according to FIGS. 3 (and 4c), first the connections 10 and 11 of the plastic film 19 are punched out at the separation points 14, and thereafter the tongues 24 and the spacers 21 are curved from the surface of the laminate. FIGS. 4a, b, c, d show tongues 1 and spacers 2 curved from the surface. The free cutting 3 is one part of the free cutting 26 which prevents that tongue 1 fits closely at the cutting edge of the plastic film 19. This provides a particularly preferred precision regarding the curving of the tongue in accordance with the invention. After the curving actions, the remaining laminate connections 13 are cut free. The module 18 is thus completed in terms of its plastic lamination and is still held in the strip structure only via the metal film 20, actually via its metallic connections 5 (according to FIGS. 4a and 4d) at the separation points 15, 16 and 17, as shown in FIG. 5.

Figure 5:
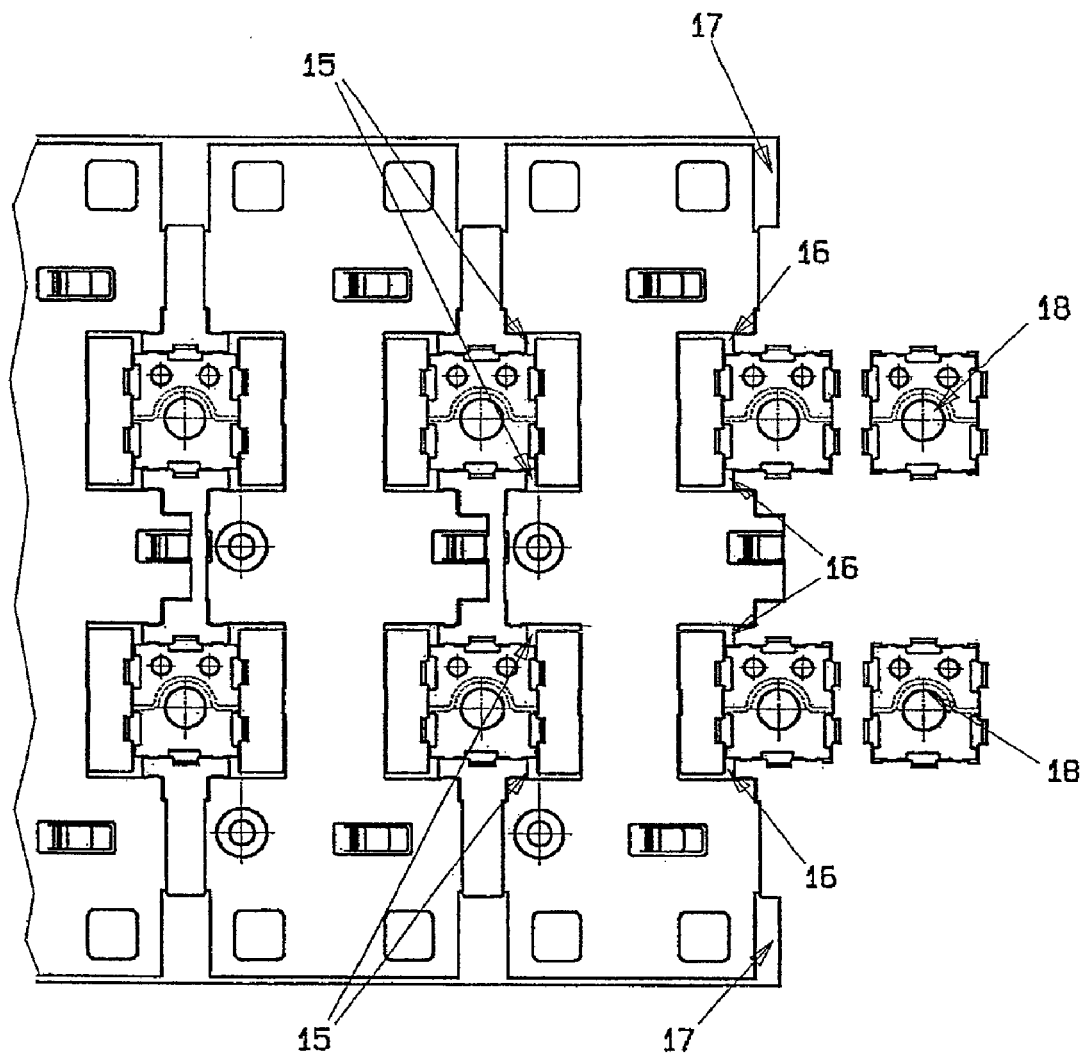
FIG. 5 is a plan view showing the isolation of the laminated modules from the laminated strip.

The modules of the carrier strip according to FIG. 5 are suitable for automatic assembly. In this case, separate reference perforations 4 are produced with a precision in the area of +0.01 mm, which are punched into the metal film after curving the tongues 24 to 1 and spacers 21 to 2. The reference perforations 4 allow precise assembly of the modules 18 with parts. The position of the curved tongues 1 is particularly precisely defined by the reference perforations 4. Such an arrangement is particularly suitable for the assembly with electronic parts. In addition to the known contacting via the base of the metal film, the embodiment with tongues according to the invention also enables contacting via the tongues 1.

The possibility according to the invention to contact not only via the base surface of the metal film but also allow contacting via the sides opens up new mounting and assembly possibilities as well as the application of electronic parts of a new design. Furthermore, the tongues 1 allow mechanical fixation as well as protection against mechanical stresses. Protection, in this case, is provided not only for additional production methods—such as injection-molding around mounted parts—but also in the final application. The holding function of tongues 1 is not limited to electronic parts.

After assembly with the parts, the modules 18 held in the metal film 20 are isolated. Isolation is provided by cutting free the remaining metallic connections at the separation points 15, 16 and 17, so that no laminate is cut in this step, and this process step can be performed under clean room conditions.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A strip-shaped laminate comprising a metal film having a first plurality of contours and a plastic film having a second plurality of contours, the plastic film being superimposed on the metal film and a plurality of modules being formed by the superimposed metal and plastic films, outlines of the first plurality of contours being different than outlines of the second plurality of contours,
   wherein portions of the laminate are devoid of the plastic film and contain only the metal film, the plurality of modules being secured within the laminate by the metal film at the portions devoid of the plastic film and containing only the metal film, and
   wherein a plurality of protrusions extend through a thickness of the laminate and project from a surface of the laminate.

2. The strip-shaped laminate according to claim 1, wherein the protrusions are tongues or spacers.

3. The strip-shaped laminate according to claim 2, wherein the tongues or spacers are bent through the laminate.

4. The strip-shaped laminate according to claim 2, wherein a plurality of the tongues are arranged as a support.

5. The strip-shaped laminate according to claim 1, wherein one film of the laminate includes disconnected contours.

6. The strip-shaped laminate according to claim 1, wherein a non-laminated area has reference perforations.

* * * * *